US007576666B2

(12) United States Patent
Mayrench et al.

(10) Patent No.: US 7,576,666 B2
(45) Date of Patent: Aug. 18, 2009

(54) JITTER CORRECTION

(75) Inventors: Ronen Mayrench, 1 Raanana (IL); Yoni Perets, Petach-Tikva (IL)

(73) Assignee: Marvell Israel Ltd., Hamilton (BM)

( * ) Notice: Subject to any disclaimer, the term of this patent is extended or adjusted under 35 U.S.C. 154(b) by 0 days.

(21) Appl. No.: 11/964,311

(22) Filed: Dec. 26, 2007

(65) Prior Publication Data

US 2008/0158032 A1 Jul. 3, 2008

Related U.S. Application Data

(60) Provisional application No. 60/882,055, filed on Dec. 27, 2006, provisional application No. 60/888,401, filed on Feb. 6, 2007.

(51) Int. Cl.
*H03M 1/06* (2006.01)

(52) U.S. Cl. ...................................... 341/118; 341/155

(58) Field of Classification Search ................. 341/118, 341/144, 155, 143; 375/240.12, 376; 702/69
See application file for complete search history.

(56) References Cited

U.S. PATENT DOCUMENTS

| | | | | |
|---|---|---|---|---|
| 6,097,879 | A * | 8/2000 | Komatsu et al. | 386/85 |
| 6,593,871 | B1 * | 7/2003 | Miethig et al. | 341/157 |
| 7,262,723 | B2 * | 8/2007 | Straussnig et al. | 341/120 |

* cited by examiner

*Primary Examiner*—Brian Young

(57) ABSTRACT

A system comprising includes a clock generator module, an analog-to-digital converter (ADC), and a correction module. The clock generator module receives a system clock and generates a digital clock that is derived from the system clock, wherein the digital clock has an average frequency. The clock generator module generates a deviation indication that indicates a deviation of the digital clock from an ideal clock of the average frequency. The ADC receives an analog signal, receives the digital clock, and generates a first stream of values by sampling the analog signal at intervals based on the digital clock. The correction module receives the first stream of values and generates a second stream of values that are corrected based on the deviation indication.

55 Claims, 11 Drawing Sheets

5
Stream of raw values
Stream of corrected values
11
30
ADC Output
Corrected ADC Output
Signal S
ADC Module
Jitter Correction Module
17
15
Derived digital clock
10
Deviation indication
Clock Generator Module

| Number of clock cycles (total 32) | 3 | 1 | 5 | 1 | 5 | 1 | 6 | 1 | 5 | 1 | 3 |
|---|---|---|---|---|---|---|---|---|---|---|---|
| Clock used | 31.2 MHz | 28.3 MHz | 31.2 MHz | 28.3 MHz | 31.2 MHz | 28.3 MHz | 31.2 MHz | 28.3 MHz | 31.2 MHz | 28.3 MHz | 31.2 MHz |

FIG. 3 o : ADC output values using sampling intervals based on derived digital clock 15

Δ : Corrected ADC output values that are corrected to estimate a value as if sampled by an ideal (i.e., jitter-free) clock

JITTER CORRECTION

CROSS-REFERENCE TO RELATED APPLICATIONS

This application claims the benefit of U.S. Provisional Application Nos. 60/888,401, filed Feb. 6, 2007, 60/882,055, Dec. 27, 2006. The disclosures of the above applications are incorporated herein by reference in their entirety.

FIELD

The present disclosure relates to electronic data processing systems, and more particularly to correcting errors in data generated by analog-to-digital and digital-to-analog converters caused by clock jitter.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electronic data processing systems including communication systems and signal processing systems use analog-to-digital converters (ADCs) to convert analog data into digital data and digital-to-analog converters (DACs) to convert digital data into analog data. For example, in communication systems, receivers may receive analog data and may use ADCs to convert the analog data into digital data. Additionally, transmitters may use DACs to convert digital data into analog data and may transmit the analog data.

Generally, the systems include oscillator circuits that generate a system clock of frequency $f_s$, which is then employed to sample analog data at specified time intervals or to reconstruct analog data. Problems can arise, however, when sampling is performed at a frequency other than $f_s$. A clock signal having a frequency other than $f_s$ may be derived, for example, by dividing the system clock, which may result in timing inaccuracies, or jitter, particularly when a non-integer division is used.

SUMMARY

A system comprises a clock generator module, an analog-to-digital converter (ADC), and a correction module. The clock generator module receives a system clock and generates a digital clock that is derived from the system clock, wherein the digital clock has an average frequency. The clock generator module generates a deviation indication that indicates a deviation of the digital clock from an ideal clock of the average frequency. The ADC receives an analog signal, receives the digital clock, and generates a first stream of values by sampling the analog signal at intervals based on the digital clock. The correction module receives the first stream of values and generates a second stream of values that are corrected based on the deviation indication.

In another feature, the digital clock is derived from the system clock using a non-integer derivation. The deviation indication includes modulo indexes of ADC samples in a modulo cycle of the digital clock. The digital clock is generated by combining an unequal number of clock cycles of a plurality of clocks that are integer divisions of the system clock. The digital clock is generated by selecting a predetermined sequence of the clock cycles.

In another feature, the correction module generates an interpolation factor based on the deviation indication and corrects the first stream of values using the interpolation factor.

In another feature, deviations between clock cycles of the digital clock and clock cycles of the ideal clock correspond to jitter.

In still other features, a system comprises a clock generator module, a correction module, and a digital-to-analog converter (DAC). The clock generator module receives a system clock and generates a digital clock that is derived from the system clock, wherein the digital clock has an average frequency. The clock generator module generates a deviation indication that indicates a deviation of the digital clock from an ideal clock of the average frequency. The correction module receives a first stream of digital values and generates a second stream of corrected digital values that are corrected based on the deviation indication. The DAC receives the second stream of corrected digital values, receives the digital clock, and generates an analog signal that is based on the second stream of corrected digital values and corresponding sampling points of the digital clock.

In another feature, the system further comprises a delay circuit that delays the digital clock and that generates a delayed digital clock, wherein the DAC generates the analog signal that is based on the second stream of corrected digital values and the delayed digital clock.

In another feature, the digital clock is derived from the system clock using a non-integer derivation. The digital clock is generated by combining an unequal number of clock cycles of a plurality of clocks that are integer divisions of the system clock. The digital clock is generated by selecting a predetermined sequence of the clock cycles.

In another feature, the correction module generates an interpolation factor based on the deviation indication and corrects the first stream of values using the interpolation factor.

In another feature, deviations between clock cycles of the digital clock and clock cycles of the ideal clock correspond to jitter.

In still other features, a system comprises a clock generator module, an analog-to-digital converter (ADC) module, and a correction module. The clock generator module generates a digital clock by combining clock cycles of a plurality of clock signals in a predetermined sequence. The ADC module samples an input based on the digital clock and generates first sample values. The correction module generates correction factors based on the predetermined sequence, corrects the first sample values using the correction factors, and generates second sample values.

In another feature, the clock generator module comprises a plurality of divider modules, a control module, and a selector module. The plurality of divider modules divides a system clock and generates the plurality of clock signals. The control module generates the predetermined sequence. The selector module selects the clock cycles based on the predetermined sequence. A first frequency of the system clock is a non-integer multiple of a second frequency of the digital clock.

In another feature, the correction module comprises a plurality of multiplier modules and a summing module. The plurality of multiplier modules multiplies the first sample values by the correction factors and generates multiplier outputs. The summing module sums the multiplier outputs and generates the second sample values.

In another feature, the correction module includes an interpolation module, and the correction factors include interpolation factors.

In another feature, the correction module corrects errors in the first sample values that are caused by jitter in the digital clock.

In another feature, the correction module further comprises a delay line that includes a plurality of delay elements, that receives the first sample values, and that generates a plurality of delayed outputs. The correction module multiplies the delayed outputs by the correction factors, generates multiplication results, and sums the multiplication results to generate the second sample values.

In still other features, a system comprises a clock generator module, a correction module, and a digital-to-analog converter (DAC) module. The clock generator module generates a digital clock by combining clock cycles of a plurality of clock signals in a predetermined sequence. The correction module receives first digital sample values, generates correction factors based on the predetermined sequence, corrects the first digital sample values using the correction factors, and generates second digital sample values. The DAC module converts the second digital sample values into an analog output based on the digital clock.

In another feature, the system further comprises a delay circuit that delays the digital clock and that generates a delayed digital clock, wherein the DAC module generates the analog output based on the delayed digital clock.

In another feature, the clock generator module comprises a plurality of divider modules, a control module, and a selector module. The plurality of divider modules divides a system clock and generates the plurality of clock signals. The control module generates the predetermined sequence. The selector module selects the clock cycles based on the predetermined sequence. A first frequency of the system clock is a non-integer multiple of a second frequency of the digital clock.

In another feature, the correction module comprises a plurality of multiplier modules and a summing module. The plurality of multiplier modules multiplies the first digital sample values by the correction factors and generates multiplier outputs. The summing module sums the multiplier outputs and generates the second digital sample values.

In another feature, the correction module includes an interpolation module, and the correction factors include interpolation factors.

In another feature, the second digital sample values represent the first digital sample values that are adjusted for jitter in the digital clock.

In still other features, a method comprises receiving a system clock and generating a digital clock having an average frequency by deriving the digital clock from the system clock. The method further comprises generating a deviation indication that indicates a deviation of the digital clock from an ideal clock having the average frequency. The method further comprises receiving an analog signal and the digital clock and generating a first stream of values by sampling the analog signal at intervals based on the digital clock. The method further comprises correcting the first stream of values based on the deviation indication and generating a second stream of values that are corrected based on the deviation indication.

In another feature, the method further comprises deriving the digital clock from the system clock using a non-integer derivation. The method further comprises generating the digital clock by combining an unequal number of clock cycles of a plurality of clocks that are integer divisions of the system clock. The method further comprises generating the digital clock by selecting a predetermined sequence of the clock cycles.

In another feature, the method further comprises generating an interpolation factor based on the deviation indication and correcting the first stream of values using the interpolation factor.

In another feature, deviations between clock cycles of the digital clock and clock cycles of the ideal clock correspond to jitter.

In still other features, a method comprises receiving a system clock and generating a digital clock having an average frequency by deriving the digital clock from the system clock. The method further comprises generating a deviation indication that indicates a deviation of the digital clock from an ideal clock having the average frequency. The method further comprises receiving a first stream of digital values, correcting the first stream of digital values based on the deviation indication, and generating a second stream of corrected digital values that are corrected based on the deviation indication. The method further comprises receiving the second stream of corrected digital values and the digital clock and generating an analog signal that is based on the second stream of corrected digital values and corresponding sampling points of the digital clock.

In another feature, the method further comprises generating a delayed digital clock and generating the analog signal that is based on the second stream of corrected digital values and the delayed digital clock.

In another feature, the method further comprises deriving the digital clock from the system clock using a non-integer derivation. The method further comprises generating the digital clock by combining an unequal number of clock cycles of a plurality of clocks that are integer divisions of the system clock. The method further comprises generating the digital clock by selecting a predetermined sequence of the clock cycles.

In another feature, the method further comprises generating an interpolation factor based on the deviation indication and correcting the first stream of values using the interpolation factor.

In another feature, deviations between clock cycles of the digital clock and clock cycles of the ideal clock correspond to jitter.

In still other features, a method comprises generating a digital clock by combining clock cycles of a plurality of clock signals in a predetermined sequence and generating correction factors based on the predetermined sequence. The method further comprises generating first sample values by sampling an input based on the digital clock and generating second sample values by correcting the first sample values using the correction factors.

In another feature, the method further comprises generating the plurality of clock signals by dividing a system clock, generating the predetermined sequence, and selecting the clock cycles based on the predetermined sequence. A first frequency of the system clock is a non-integer multiple of a second frequency of the digital clock.

In another feature, the method further comprises generating multiplier outputs by multiplying the first sample values by the correction factors and generating the second sample values by summing the multiplier outputs.

In another feature, the correction factors include interpolation factors.

In another feature, the method further comprises correcting errors in the first sample values that are caused by jitter in the digital clock.

In another feature, the method further comprises generating delayed outputs by delaying the first sample values, generating multiplication results by multiplying the delayed outputs by the correction factors, and generating the second sample values by summing the multiplication results.

In still other features, a method comprises generating a digital clock by combining clock cycles of a plurality of clock signals in a predetermined sequence and generating correction factors based on the predetermined sequence. The method further comprises receiving first digital sample values and generating second digital sample values by correcting the first digital sample values using the correction factors. The method further comprises converting the second digital sample values into an analog output based on the digital clock.

In another feature, the method further comprises generating a delayed digital clock by delaying the digital clock and generating the analog output based on the delayed digital clock.

In another feature, the method further comprises generating the plurality of clock signals by dividing a system clock, generating the predetermined sequence, and selecting the clock cycles based on the predetermined sequence. A first frequency of the system clock is a non-integer multiple of a second frequency of the digital clock.

In another feature, the method further comprises generating multiplier outputs by multiplying the first sample values by the correction factors and generating the second sample values by summing the multiplier outputs.

In another feature, the correction factors include interpolation factors.

In another feature, the second digital sample values represent the first digital sample values that are adjusted for jitter in the digital clock.

In still other features, a system comprises clock generating means for receiving a system clock, generating a digital clock that is derived from the system clock, wherein the digital clock has an average frequency, and generating a deviation indication that indicates a deviation of the digital clock from an ideal clock of the average frequency. The system further comprises analog-to-digital converter (ADC) means for receiving an analog signal, receiving the digital clock, and generating a first stream of values by sampling the analog signal at intervals based on the digital clock. The system further comprises correction means for receiving the first stream of values and generating a second stream of values that are corrected based on the deviation indication.

In another feature, the digital clock is derived from the system clock using a non-integer derivation. The digital clock is generated by combining an unequal number of clock cycles of a plurality of clocks that are integer divisions of the system clock. The digital clock is generated by selecting a predetermined sequence of the clock cycles.

In another feature, the correction means generates an interpolation factor based on the deviation indication and corrects the first stream of values using the interpolation factor.

In another feature, deviations between clock cycles of the digital clock and clock cycles of the ideal clock correspond to jitter.

In still other features, a system comprises clock generating means for receiving a system clock, generating a digital clock that is derived from the system clock, wherein the digital clock has an average frequency, and generating a deviation indication that indicates a deviation of the digital clock from an ideal clock of the average frequency. The system further comprises correction means for receiving a first stream of digital values and generating a second stream of corrected digital values that are corrected based on the deviation indication. The system further comprises digital-to-analog converter (DAC) means for receiving the second stream of corrected digital values, receiving the digital clock, and generating an analog signal that is based on the second stream of corrected digital values and corresponding sampling points of the digital clock.

In another feature, the system further comprises delay means for delaying the digital clock and generating a delayed digital clock, wherein the DAC means generates the analog signal that is based on the second stream of corrected digital values and the delayed digital clock.

In another feature, the digital clock is derived from the system clock using a non-integer derivation. The digital clock is generated by combining an unequal number of clock cycles of a plurality of clocks that are integer divisions of the system clock. The digital clock is generated by selecting a predetermined sequence of the clock cycles.

In another feature, the correction means generates an interpolation factor based on the deviation indication and corrects the first stream of values using the interpolation factor.

In another feature, deviations between clock cycles of the digital clock and clock cycles of the ideal clock correspond to jitter.

In still other features, a system comprises clock generating means for generating a digital clock by combining clock cycles of a plurality of clock signals in a predetermined sequence. The system further comprises analog-to-digital converter (ADC) means for sampling an input based on the digital clock and generating first sample values. The system further comprises correction means for generating correction factors based on the predetermined sequence, correcting the first sample values using the correction factors, and generating second sample values.

In another feature, the clock generating means comprises plurality of divider means for dividing a system clock and generating the plurality of clock signals, control means for generating the predetermined sequence, and selector means for selecting the clock cycles based on the predetermined sequence. A first frequency of the system clock is a non-integer multiple of a second frequency of the digital clock.

In another feature, the correction means comprises plurality of multiplier means for multiplying the first sample values by the correction factors and generating multiplier outputs and summing means for summing the multiplier outputs and generating the second sample values.

In another feature, the correction means includes an interpolation means for generating interpolation factors and correcting the first sample values using the interpolation factors.

In another feature, the correction means corrects errors in the first sample values that are caused by jitter in the digital clock.

In another feature, the correction means further comprises delay means for receiving the first sample values and generating a plurality of delayed outputs. The correction means multiplies the delayed outputs by the correction factors, generates multiplication results, and sums the multiplication results to generate the second sample values.

In still other features, a system comprises clock generating means for generating a digital clock by combining clock cycles of a plurality of clock signals in a predetermined sequence. The system further comprises correction means for receiving first digital sample values, generating correction factors based on the predetermined sequence, correcting the first digital sample values using the correction factors, and generating second digital sample values. The system further comprises digital-to-analog converter (DAC) means for converting the second digital sample values into an analog output based on the digital clock.

In another feature, the system further comprises delay means for delaying the digital clock and generating a delayed digital clock, wherein the DAC means generates the analog output based on the delayed digital clock.

In another feature, the clock generating means comprises plurality of divider means for dividing a system clock and generating the plurality of clock signals, control means for generating the predetermined sequence, and selector means for selecting the clock cycles based on the predetermined sequence. A first frequency of the system clock is a non-integer multiple of a second frequency of the digital clock.

In another feature, the correction means comprises plurality of multiplier means for multiplying the first digital sample values by the correction factors and generating multiplier outputs and summing means for summing the multiplier outputs and generating the second digital sample values.

In another feature, the correction means includes an interpolation means for generating interpolation factors and correcting the first sample values using the interpolation factors.

In another feature, the second digital sample values represent the first digital sample values that are adjusted for jitter in the digital clock.

In still other features, a computer program stored on a computer-readable medium and executed by a processor comprises receiving a system clock and generating the digital clock by deriving a digital clock having an average frequency from the system clock. The computer program further comprises generating a deviation indication that indicates a deviation of the digital clock from an ideal clock having the average frequency. The computer program further comprises receiving an analog signal and the digital clock and generating a first stream of values by sampling the analog signal at intervals based on the digital clock. The computer program further comprises correcting the first stream of values based on the deviation indication and generating a second stream of values that are corrected based on the deviation indication.

In another feature, the computer program further comprises deriving the digital clock from the system clock using a non-integer derivation. The computer program further comprises generating the digital clock by combining an unequal number of clock cycles of a plurality of clocks that are integer divisions of the system clock. The computer program further comprises generating the digital clock by selecting a predetermined sequence of the clock cycles.

In another feature, the computer program further comprises generating an interpolation factor based on the deviation indication and correcting the first stream of values using the interpolation factor.

In another feature, deviations between clock cycles of the digital clock and clock cycles of the ideal clock correspond to jitter.

In still other features, a computer program stored on a computer-readable medium and executed by a processor comprises receiving a system clock and generating the digital clock by deriving a digital clock having an average frequency from the system clock. The computer program further comprises generating a deviation indication that indicates a deviation of the digital clock from an ideal clock having the average frequency. The computer program further comprises receiving a first stream of digital values, correcting the first stream of digital values based on the deviation indication, and generating a second stream of corrected digital values that are corrected based on the deviation indication. The computer program further comprises receiving the second stream of corrected digital values and the digital clock and generating an analog signal that is based on the second stream of corrected digital values and corresponding sampling points of the digital clock.

In another feature, the computer program further comprises generating a delayed digital clock and generating the analog signal that is based on the second stream of corrected digital values and the delayed digital clock.

In another feature, the computer program further comprises deriving the digital clock from the system clock using a non-integer derivation. The computer program further comprises generating the digital clock by combining an unequal number of clock cycles of a plurality of clocks that are integer divisions of the system clock. The computer program further comprises generating the digital clock by selecting a predetermined sequence of the clock cycles.

In another feature, the computer program further comprises generating an interpolation factor based on the deviation indication and correcting the first stream of values using the interpolation factor.

In another feature, deviations between clock cycles of the digital clock and clock cycles of the ideal clock correspond to jitter.

In still other features, a computer program stored on a computer-readable medium and executed by a processor comprises generating a digital clock by combining clock cycles of a plurality of clock signals in a predetermined sequence and generating correction factors based on the predetermined sequence. The computer program further comprises generating first sample values by sampling an input based on the digital clock and generating second sample values by correcting the first sample values using the correction factors.

In another feature, the computer program further comprises generating the plurality of clock signals by dividing a system clock, generating the predetermined sequence, and selecting the clock cycles based on the predetermined sequence. A first frequency of the system clock is a non-integer multiple of a second frequency of the digital clock.

In another feature, the computer program further comprises generating multiplier outputs by multiplying the first sample values by the correction factors and generating the second sample values by summing the multiplier outputs.

In another feature, the correction factors include interpolation factors.

In another feature, the computer program further comprises correcting errors in the first sample values that are caused by jitter in the digital clock.

In another feature, the computer program further comprises generating delayed outputs by delaying the first sample values, generating multiplication results by multiplying the delayed outputs by the correction factors, and generating the second sample values by summing the multiplication results.

In still other features, a computer program stored on a computer-readable medium and executed by a processor comprises generating a digital clock by combining clock cycles of a plurality of clock signals in a predetermined sequence and generating correction factors based on the predetermined sequence. The computer program further comprises receiving first digital sample values and generating second digital sample values by correcting the first digital sample values using the correction factors. The computer program further comprises converting the second digital sample values into an analog output based on the digital clock.

In another feature, the computer program further comprises generating a delayed digital clock by delaying the digital clock and generating the analog output based on the delayed digital clock.

In another feature, the computer program further comprises generating the plurality of clock signals by dividing a system clock, generating the predetermined sequence, and selecting the clock cycles based on the predetermined sequence. A first frequency of the system clock is a non-integer multiple of a second frequency of the digital clock.

In another feature, the computer program further comprises generating multiplier outputs by multiplying the first sample values by the correction factors and generating the second sample values by summing the multiplier outputs.

In another feature, the correction factors include interpolation factors.

In another feature, the second digital sample values represent the first digital sample values that are adjusted for jitter in the digital clock.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is an example of a sequence used by the clock generator module to generate the derived digital clock;

DETAILED DESCRIPTION

Figure 1:
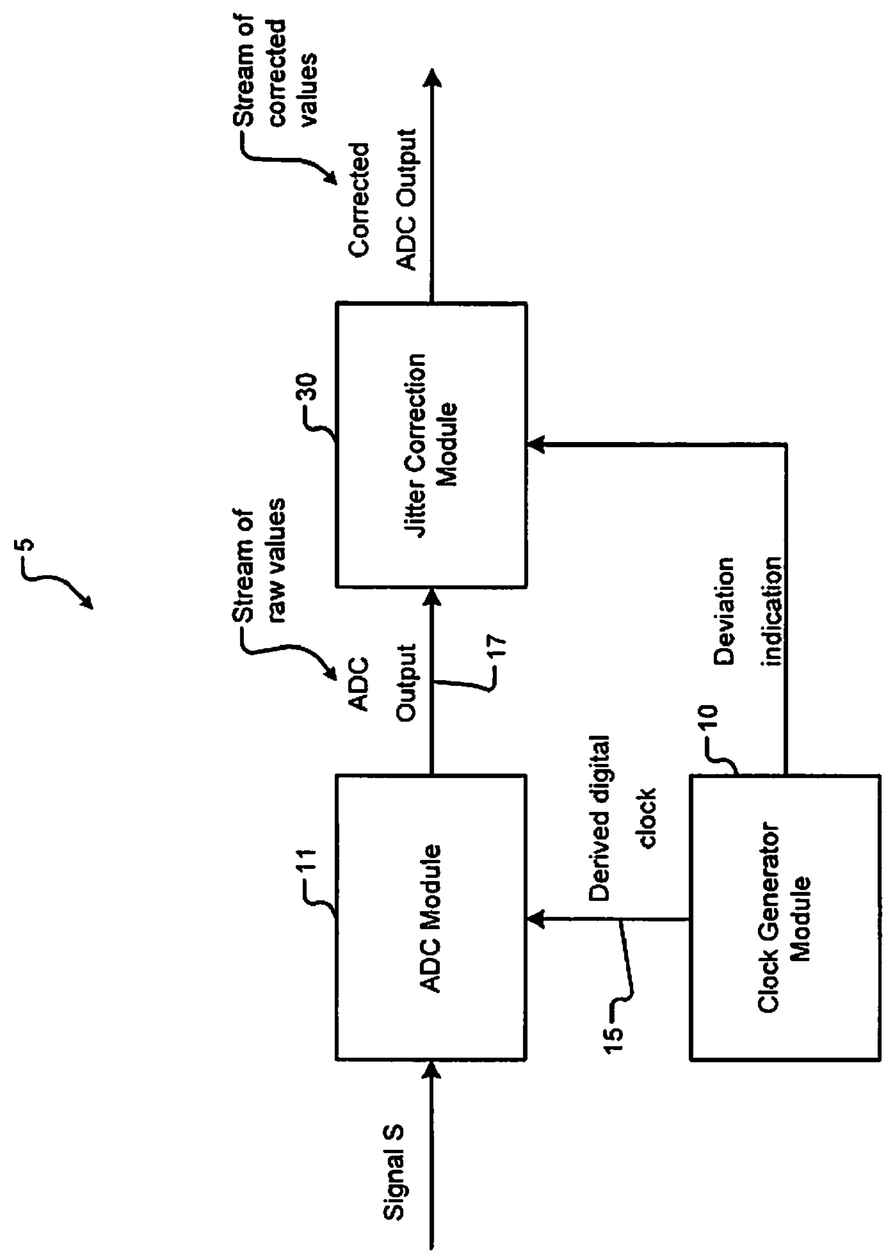
FIG. 1 is a functional block diagram of an example of an analog-to-digital converter (ADC) system comprising a jitter correction module according to the present disclosure.

The following description is merely an example of an implementation and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Referring now to FIGS. 1-8, a system 5 for correcting errors caused by jitter is shown. In FIG. 1, the system 5 comprises the clock generator module 10, an analog-to-digital converter (ADC) module 11, and the jitter correction module 30. The clock generator module 10 generates a derived digital clock 15 having a desired average frequency. The clock generator module 10 may use a sequence (i.e., a cyclic sequence) or an algorithm to derive the derived digital clock 15 from a system clock. The derived digital clock 15 typically has jitter. The ADC module 11 uses the derived digital clock 15 to sample an analog input signal S. The ADC module 11 generates an ADC output 17 comprising digital samples of the analog input signal S. The ADC output 17 typically includes a stream of raw values of the digital samples.

Additionally, the clock generator module 10 generates a deviation indication that indicates a deviation of the derived digital clock 15 from an ideal clock having the desired average frequency. The deviation may include data related to differences between the derived digital clock 15 and the ideal clock. The deviation indication can be derived from the sequence or the algorithm used to generate the derived digital clock 15. For example, the clock generator module 10 may generate an index sequence that indicates the location of the ADC output sample in the cyclic sequence of the jitter clock (i.e., the derived digital lock 15). The index sequence may be indicative of the deviation. The clock generator module 10 outputs the deviation indication and the derived digital clock 15 having jitter to the jitter correction module 30.

Based on the deviation indication, the jitter correction module 30 corrects errors in the ADC output 17 that occur due to the jitter in the derived digital clock 15. The jitter correction module 30 outputs a corrected ADC output comprising corrected values of the digital samples of the analog input signal S. The corrected ADC output typically includes a stream of corrected values. A detailed description of the clock generator module 10 and the jitter correction module 30 follows.

Figure 2:
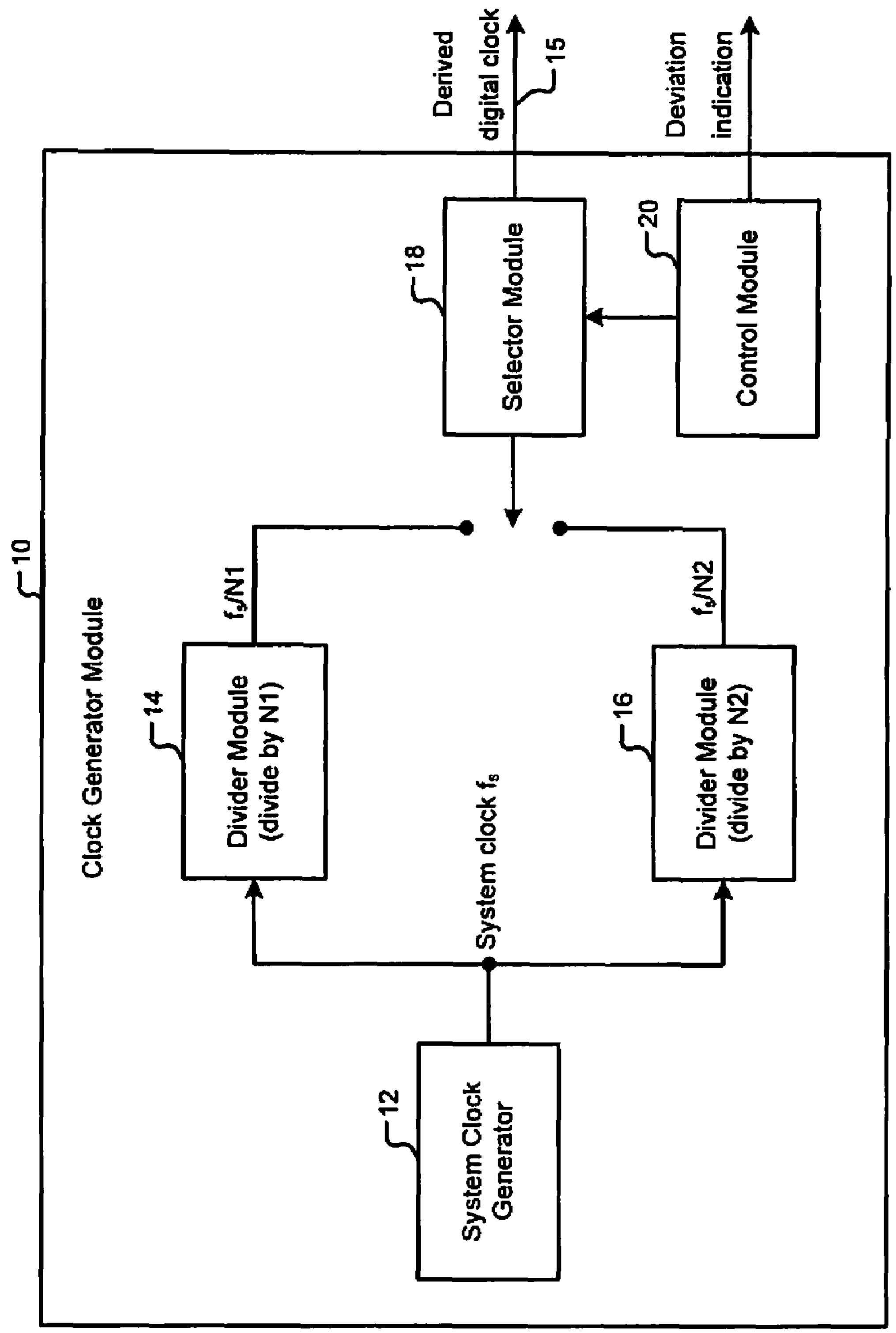
FIG. 2 is a functional block diagram of a clock generator module for generating a derived digital clock.

In FIG. 2, an example of the clock generator module 10 is shown. The clock generator module 10 comprises a system clock generator 12, divider modules 14, 16, a selector module 18, and a control module 20. The system clock generator 12 generates the system clock of frequency $f_s$. Depending on a sampling rate of the ADC module 11, $f_s$ may not be an integer multiple of the average frequency of the derived digital clock 15. For example, $f_s$ may be 312 MHz while the average frequency of the derived digital clock 15 used by the ADC module 11 may be 30.72 MHz, where 312/30.72 is not an integer.

When $f_s$ is not an integer multiple of the average frequency of the derived digital clock 15, the derived digital clock 15 may be generated using various methods. For example, the system clock may be divided into a plurality of clock signals, where each clock signal has a frequency that is an integer factor of $f_s$. The clock signals may then be combined to generate the derived digital clock 15 that is suitable for the ADC module 11.

Specifically, the divider module 14 may divide the system clock and generate a first divided clock signal having a frequency $f_s$/N1, where N1 is an integer greater than 1. The divider module 16 may divide the system clock and generate a second divided clock signal having a frequency $f_s$/N2, where N2 is an integer greater than 1 and different than N1. Although two divider modules 14, 16 are shown, more than two divider modules may be used to generate more than two divided clock signals.

The selector module 18 may select different number of clock cycles of the first and second divided clock signals and generate the derived digital clock 15 having the average frequency that is suitable for the ADC module 11 to sample the analog input signal S. The control module 20 may generate a sequence that the selector module 18 may use to select the number of clock cycles of the first and second divided clock signals.

For example, the system clock generator 12 may generate the system clock having the frequency $f_s$=312 MHz. The clock generator module 10 may generate the derived digital clock 15 of the average frequency 30.72 MHz as follows. The divider module 14 may divide the system clock by N1=10 and generate the first divided clock signal having a frequency $f_s$/N1=31.2 MHz. The divider module 16 may divide the system clock by N2=11 and generate the second divided clock signal having a frequency $f_s$/N2=28.36 MHz.

The control module 20 may generate a sequence of 32 clock cycles shown in a table in FIG. 3. Specifically, the control module 20 may generate the sequence that the selector module 18 may use to select a predetermined number of clock cycles of the first and second divided clock signals. The control module 20 may input the sequence to selector module 18.

Based on the sequence, the selector module 18 may select 3 clock cycles of the first divided clock signal, followed by 1 clock cycle of the second divided clock signal, followed by five clock cycles of the first divided clock signal, and so on. Thus, the selector module 18 may select 27 clock cycles of the first divided clock signal and 5 clock cycles of the second divided clock signal. After selecting a total of 32 clock cycles of the first and second divided clock signals according to the sequence, the selector module 18 may repeat the sequence to generate the derived digital clock 15.

The period of the derived digital clock 15 can be mathematically expressed by the following equation.

$$T_{30.72}=T^*[(27^*N1)+(5^*N2)]/(27+5)=T^*[(27^*10)+(5^*11)]/32,$$

where T denotes a period of the system clock (i.e., T=1/$f_s$). Accordingly, when $f_s$=312 MHz, the average frequency of the derived digital clock 15 is:

$$f_{30.72}=1/T_{30.72}=30.72\text{ MHz}.$$

The sequence shown in FIG. 3 is merely an example. The control module 20 may generate other sequences based on which the selector module 18 can generate the derived digital clock 15 having the average frequency 30.72 MHz. For example, the sequence may include a different combination of the number of clock cycles of the first and second divided clock signals. Additionally, the total number of clock cycles in the sequence may be different than 32. Thus, the sequence may include a predetermined order of a predetermined number of clock cycles of two or more divided clock signals.

When the ADC module 11 samples the analog input signal S and generates digital samples using the derived digital clock 15 having jitter, the values of the digital samples may be incorrect. This is because the ADC module 11 may generate the digital samples at incorrect times due to the jitter in the derived digital clock 15.

Figure 4:
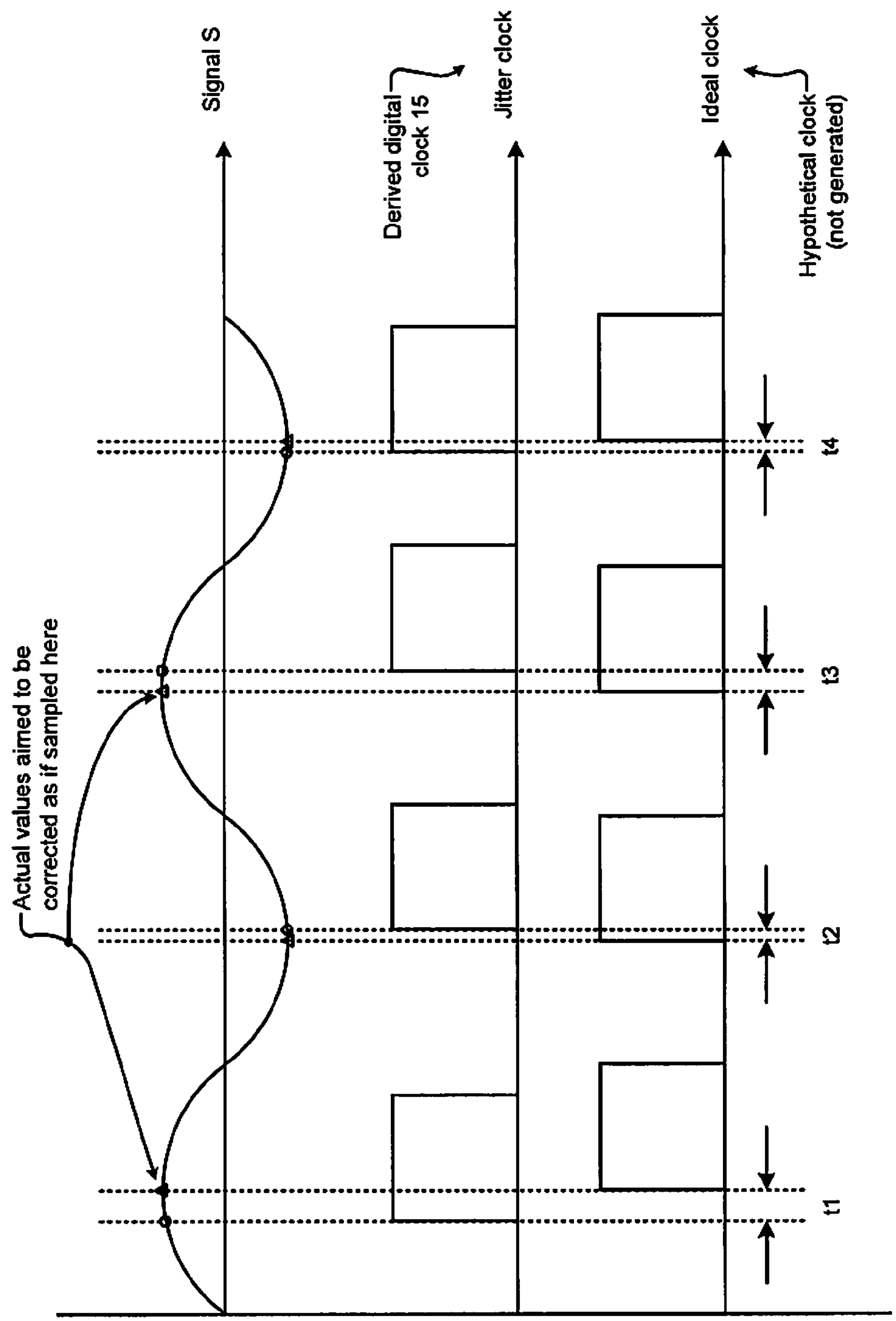
FIG. 4 depicts clock inputs and outputs in accordance with an embodiment.

In FIG. 4, effects of jitter on the ADC output 17 are shown. Specifically, FIG. 4 shows samples actually generated by the ADC module 11 using the derived digital clock 15 (i.e., jitter clock) and the correct samples that the ADC module 11 would have generated if no jitter is present (i.e., if the clock is ideal or jitter-free). Due to jitter, the rising edges of the jitter clock (i.e., the times at which the ADC module 11 samples the signal S) occur at times that are different than the times at which the rising edges of an ideal clock would occur at the desired frequency. Consequently, the ADC module 11 typically samples the signal S at incorrect times and generates the ADC output 17 having incorrect values when the ADC module 11 uses the jitter clock.

The time differences t1, t2, . . . , etc. between the rising edges of the jitter clock and the respective rising edges of the ideal clock may depend on the sequence or the algorithm used to derive the jitter clock from the system clock. Accordingly, sampling errors (i.e., differences between values of digital samples generated using the jitter clock and values of corresponding digital samples that would be generated if the clock used is ideal) may depend on the sequence or the algorithm used to generate the jitter clock.

One way to minimize effects of jitter is to generate jitter-free derived digital clock. For example, jitter-free derived digital clock may be generated using phase-locked loops (PLLs) (not shown). PLLs, however, may increase hardware cost. Instead, the jitter correction module 30 may be used to correct errors in the ADC output 17 that occur due to jitter in the derived digital clock 15. The jitter correction module 30 corrects errors due to jitter as follows.

Figure 5:
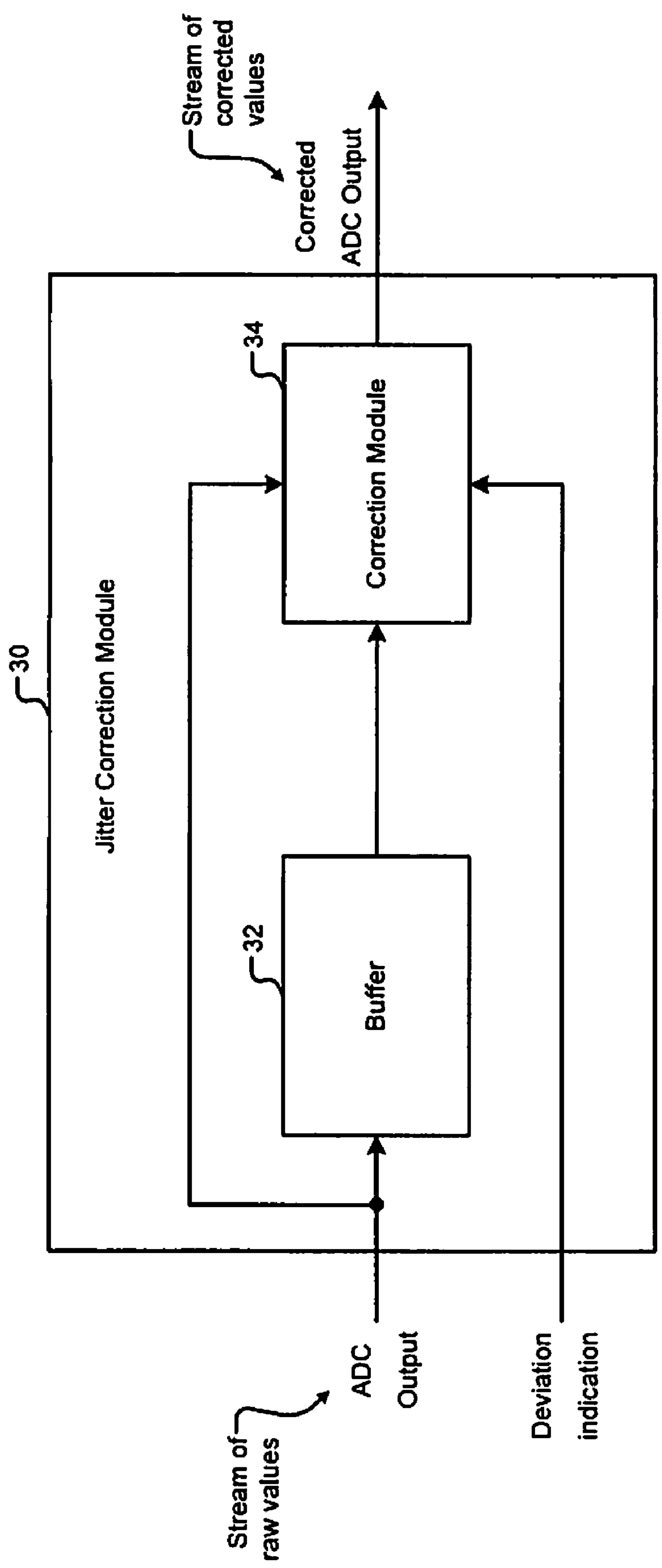
FIG. 5 is a functional block diagram of an example of a jitter correction module according to the present disclosure.

In FIG. 5, an example of the jitter correction module 30 is shown. The jitter correction module 30 may comprise a buffer 32 and a correction module 34. The buffer 32 may store one or more values sampled by the ADC module 11. The correction module 34 may correct the values sampled by the ADC module 11 using suitable forms of data correction. For example, the correction module 34 may correct the values using extrapolation or interpolation. When using interpolation, the correction module 34 may interpolate the values generated by the ADC module 11 and the values stored in the buffer 32.

The correction module 34 may generate correction factors based on the deviation indication received from the clock generator module 10 and may use the correction factors to generate corrected samples. The corrected samples may have values that are corrected for any jitter in the derived digital clock 15. Thus, the corrected values of the ADC output samples may represent an estimation of values that the ADC module 11 would have generated by sampling the input signal S at intervals without the jitter.

More specifically, the deviation indication may include modulo indexes of the ADC output samples in a modulo cycle of the jitter clock (i.e., the derived digital clock 15). For example, when the sequence of 32 clock cycles shown in FIG. 3 is used to generate the derived digital clock 15, the deviation indication may include 32 different indexes (1-32) that indicate the sample position of the ADC output samples within the 32 sequence modulo cycle of the jitter clock. The correction module 34 uses the sequence of the 32 indexes to generate 32 sets of correction factors. The correction module 34 selects an appropriate set of correction factors to correct an ADC output sample based on a modulo index of that ADC output sample. Thus, the correction module 34 corrects the ADC output samples in a modulo 32 manner. That is, after using the last set of correction factors to correct the last sample (index=32) in the sequence, the next sample (index=1) is corrected using the first set of correction factors.

Figure 6:
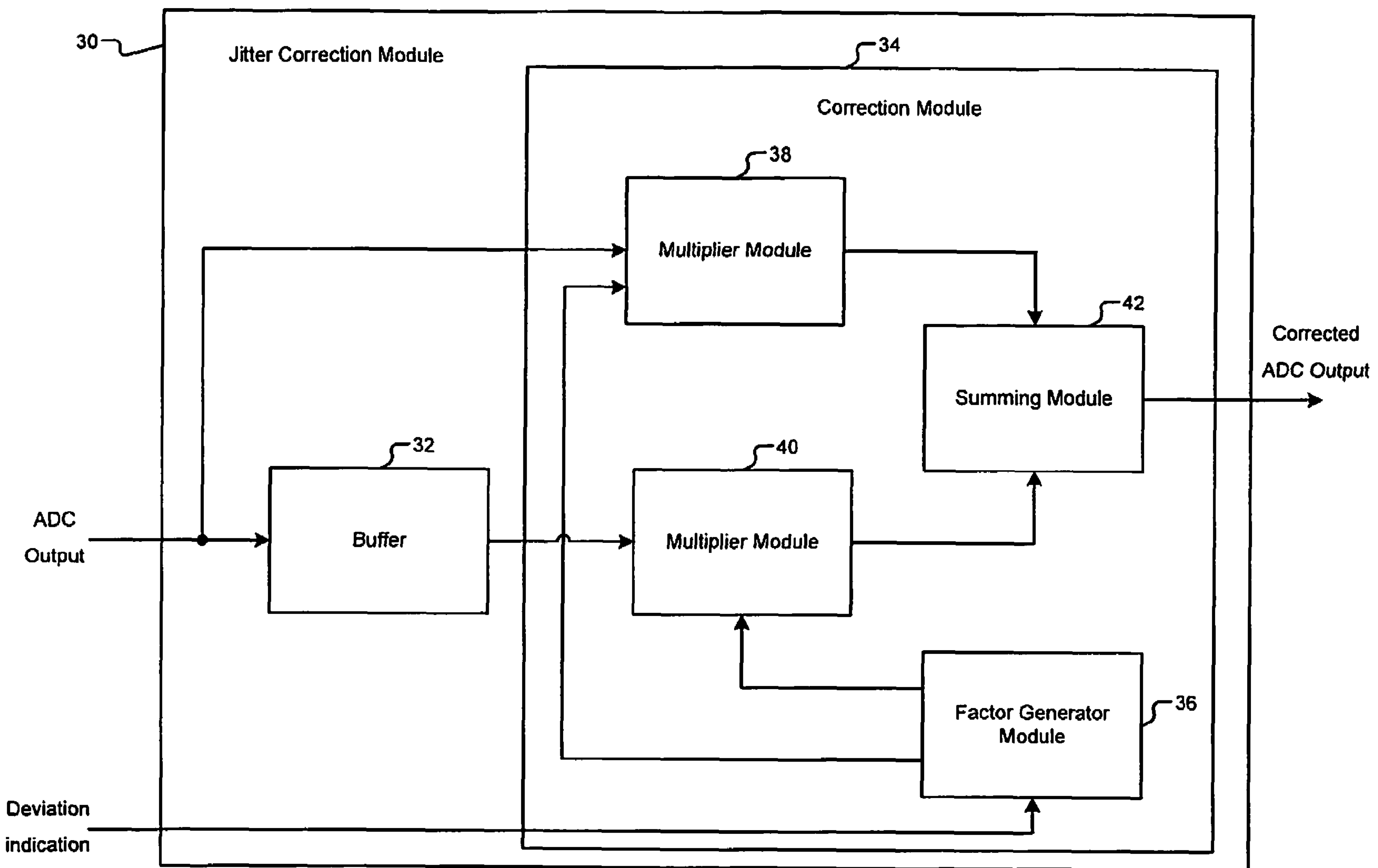
FIG. 6 is a functional block diagram of an example of a correction module used by the jitter correction module according to the present disclosure.

In FIG. 6, an example of the correction module 34 is shown. The correction module 34 may comprise, for example, a factor generator module 36, multiplier modules 38, 40, and a summing module 42. The factor generator module 36 generates the correction factors based on the deviation indication (e.g., a sequence input) provided by the clock generator module 10.

As an example, when linear interpolation is used, the factor generator module 36 may generate 32 sets of first and second interpolation factors (e.g., $(c_1, d_1)$, $(c_2, d_2)$, . . . , and $(c_{32}, d_{32})$) when the derived digital clock 15 is generated using the sequence of 32 clock cycles of the first and second divided clock signals. Thus, if a total of P clock cycles (e.g., P=32) of Q divided clock signals (e.g., Q=2) are used to generate the derived digital clock 15, the factor generator module 36 may generate P sets of correction factors. Each set may include N factors, where N is a function of a desired degree of interpolation and may be related to Q.

Initially, the ADC module 11 may output a sample N, where N is an integer greater than or equal to 1. The correction module 34 may output the sample N as a sample N'. The buffer 32 may store the sample N. The ADC module 11 may output a sample (N+1). The factor generator module 36 may output a first set of correction factors (e.g., $c_1$, and $d_1$) to the multiplier modules 38, 40, respectively. The correction factors may include interpolation factors when interpolation is used.

The multiplier module 38 may receive the sample (N+1) from the ADC module 11, multiply the sample (N+1) by the correction factor $c_1$, and generate a first output. The multiplier module 40 may receive the sample N from the buffer 32, multiply the sample N by the correction factor $d_1$, and generate a second output. The summing module 42 may sum the first and second outputs and generate a corrected value of the sample (e.g., an interpolated sample) (N+1)'. The corrected value of the sample (N+1)' is the estimated value of the sample (N+1) that is corrected for any jitter in the derived digital clock 15 based on the deviation indication.

Subsequently, the buffer 32 may store the sample (N+1). The ADC module 11 may output a sample (N+2). The factor generator module 36 may output a second set of correction factors (e.g., $c_2$, and $d_2$) to the multiplier modules 38, 40, respectively. The multiplier module 38 may receive the sample (N+2) from the ADC module 11, multiply the sample (N+2) by the correction factor $c_2$, and generate the first output. The multiplier module 40 may receive the sample (N+1) from the buffer 32, multiply the sample (N+1) by the correction factor $d_2$, and generate the second output. The summing module 42 may sum the first and second outputs and generate a corrected value of the sample (N+2)'. The corrected value of the sample (N+2)' is the estimated value of the sample (N+2) that is corrected for any jitter in the derived digital clock 15 based on the deviation indication.

Figure 7:
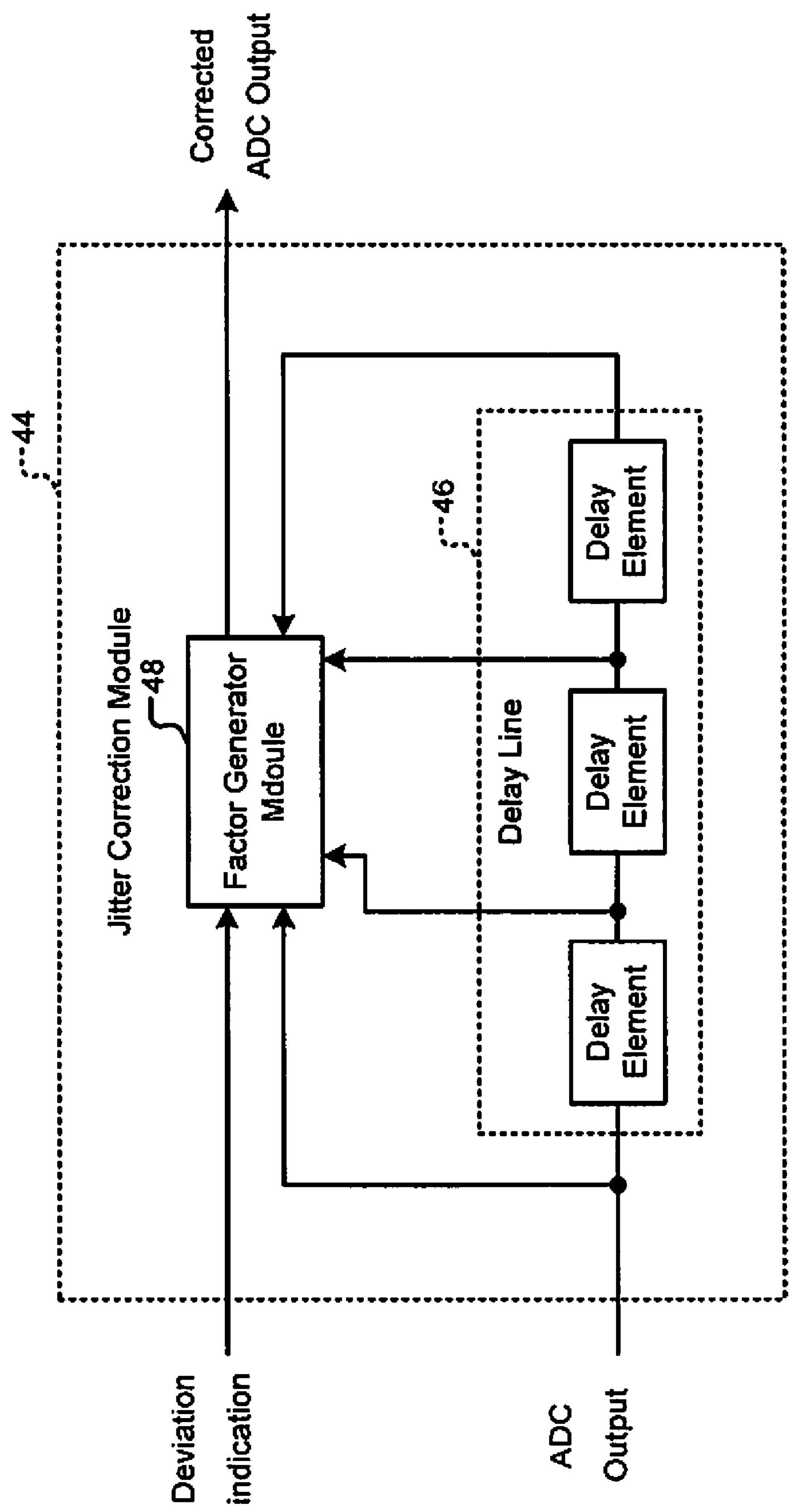
FIG. 7 is a functional block diagram of an example of a jitter correction module according to the present disclosure.

In FIG. 7, an example of a jitter correction module utilizing a delay line is shown. A jitter correction module 44 may include a delay line 46 and a factor generator module 48. The delay line 46 may include a plurality of delay elements. The ADC output samples generated by the ADC module 11 are input to the delay line 46. An output of each delay element is input to the factor generator module 48. The factor generator module 48 generates correction factors based on the deviation indication (e.g., sequence input) provided by the clock generator module 10. The factor generator module 48 multiplies the output of each delay element by a correction factor according to the sequence input. The factor generator module 48 sums the results of the multiplications to generate the corrected ADC output 17.

Figure 8:
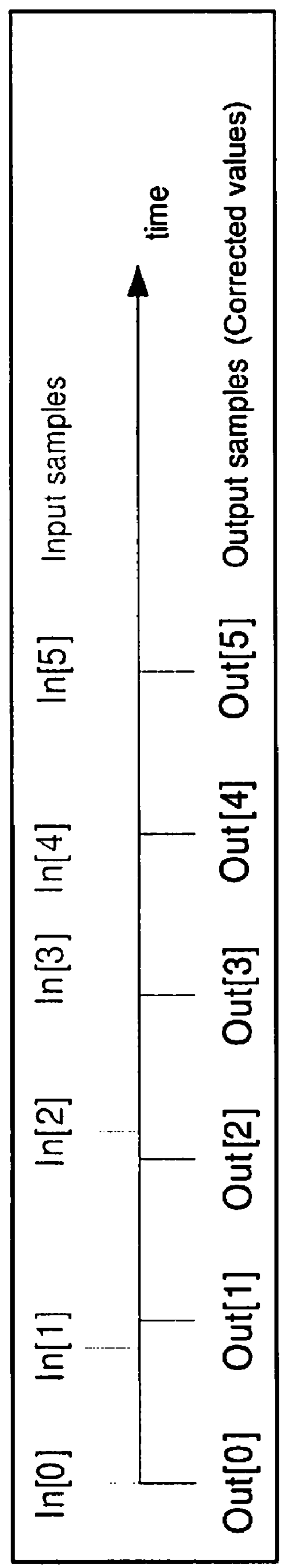
FIG. 8 depicts an example of results of corrections performed by the jitter correction module according to the present disclosure.

In FIG. 8, an example of results of correction is shown. The correction corrects the raw values of the ADC output 17. Specifically, the raw values of the output samples generated by the ADC module 11 are corrected to correspond to the values that the output samples would have had if the samples were sampled at correct times by the jitter-free ideal clock, namely a clock with equally spaced phases. Thus, the corrected values may represent values of the respective input samples corrected for jitter, which are output as the stream of corrected values.

Figure 9:
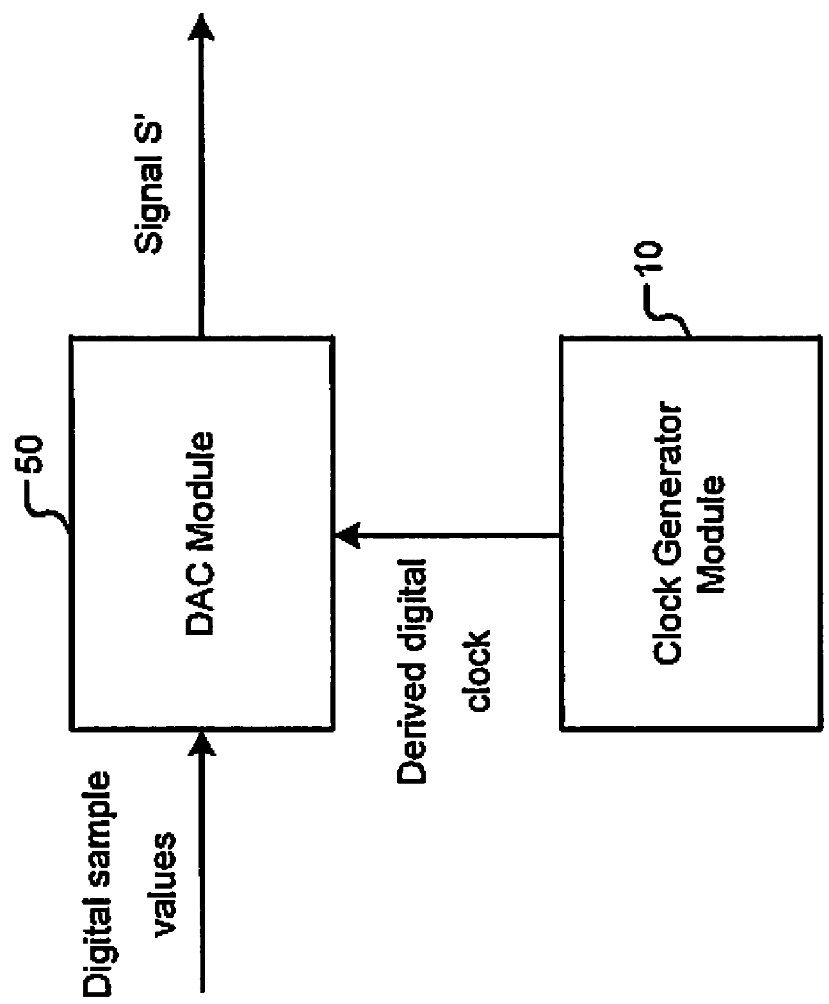
FIG. 9 is a functional block diagram of an example of a digital-to-analog converter (DAC) system.
Figure 10:
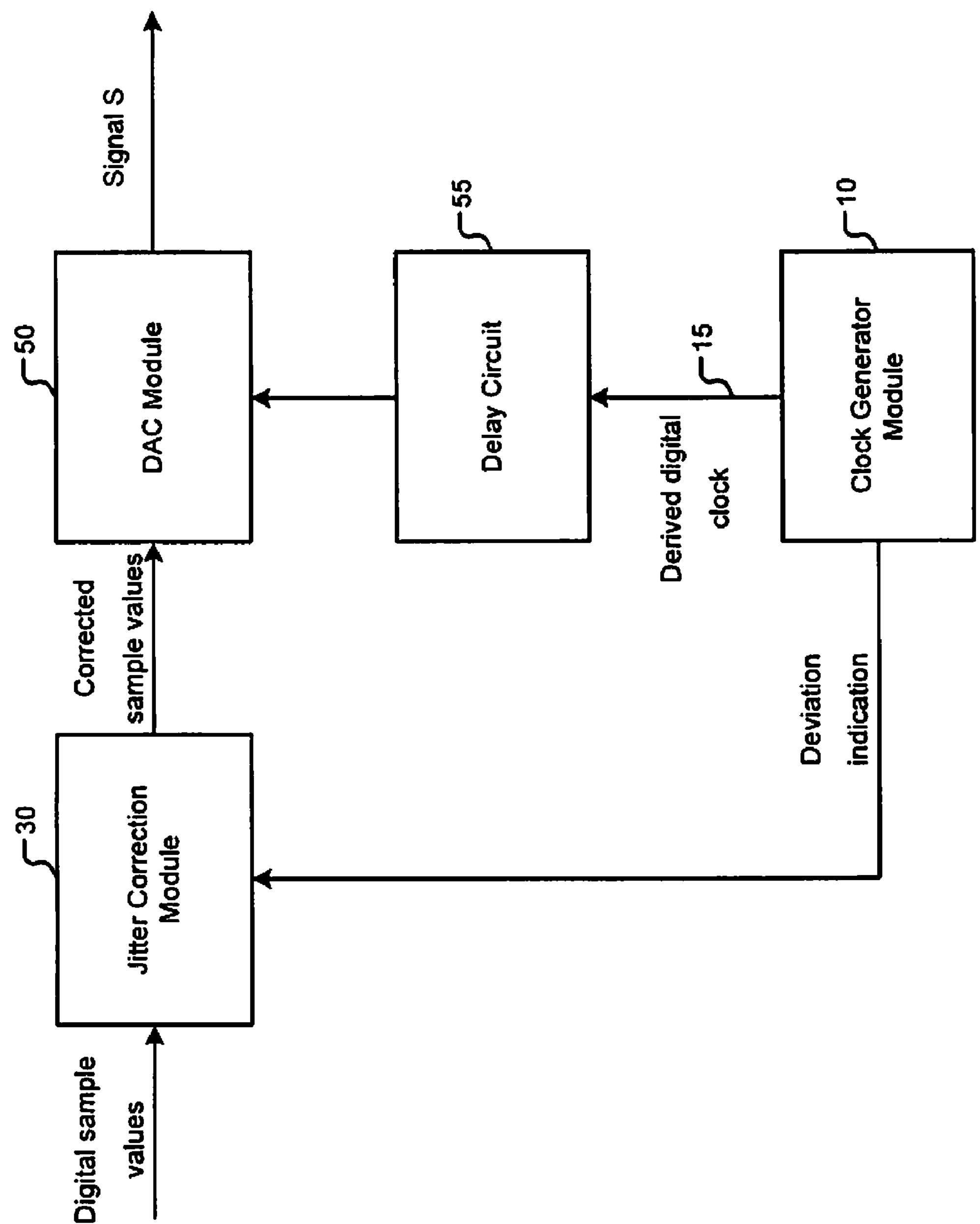
FIG. 10 is a functional block diagram of an example of a DAC system comprising a jitter correction module according to the present disclosure.

Referring now to FIGS. 9 and 10, a system for correcting errors caused by jitter in a digital-to-analog converter (DAC) system is shown. In FIG. 9, a DAC module 50 may convert digital samples and generate an analog output signal S'. The DAC module 50 may be clocked by the derived digital clock 15 generated by the clock generator module 10. When jitter is present in the derived digital clock 15, the DAC module 50 may convert the digital samples at incorrect times. Consequently, the analog output signal S' generated may be incorrect. For example, instead of converting a sample at time T, the DAC module 50 may convert the sample at time $(T \pm t_j)$ resulting in an incorrect analog output signal S'.

In FIG. 10, the jitter correction module 30 may modify values of the digital samples input to the DAC module 50 to compensate for jitter. The jitter correction module 30 may receive the digital sample values to be converted by the DAC module 50. The jitter correction module 30 may generate corrected sample values based on the deviation indication received from the clock generator module 10. The jitter correction module 30 may generate the corrected sample values from the digital sample values in the same manner as the jitter correction module 30 generates the corrected sample values from the samples generated by the ADC module 11. For example, the jitter correction module 30 may use interpolation for correction.

The corrected values of the samples represent values of the digital samples that are adjusted for jitter, that is to say, the estimated actual values of the analog signal at sampling locations when clock with jitter is used. The corrected sample values are input to the DAC module 50.

A delay circuit 55 delays the derived digital clock 15 and outputs the delayed digital clock to the DAC module 50. The delayed digital clock corresponds to the corrected sample values. The DAC module 50 converts the corrected sample values based on the delayed digital clock and generates the correct analog output signal S. Specifically, the DAC module 50 converts the corrected sample values at times that include jitter. Accordingly, the analog output signal S correctly represents data provided by the digital samples.

Figure 11:
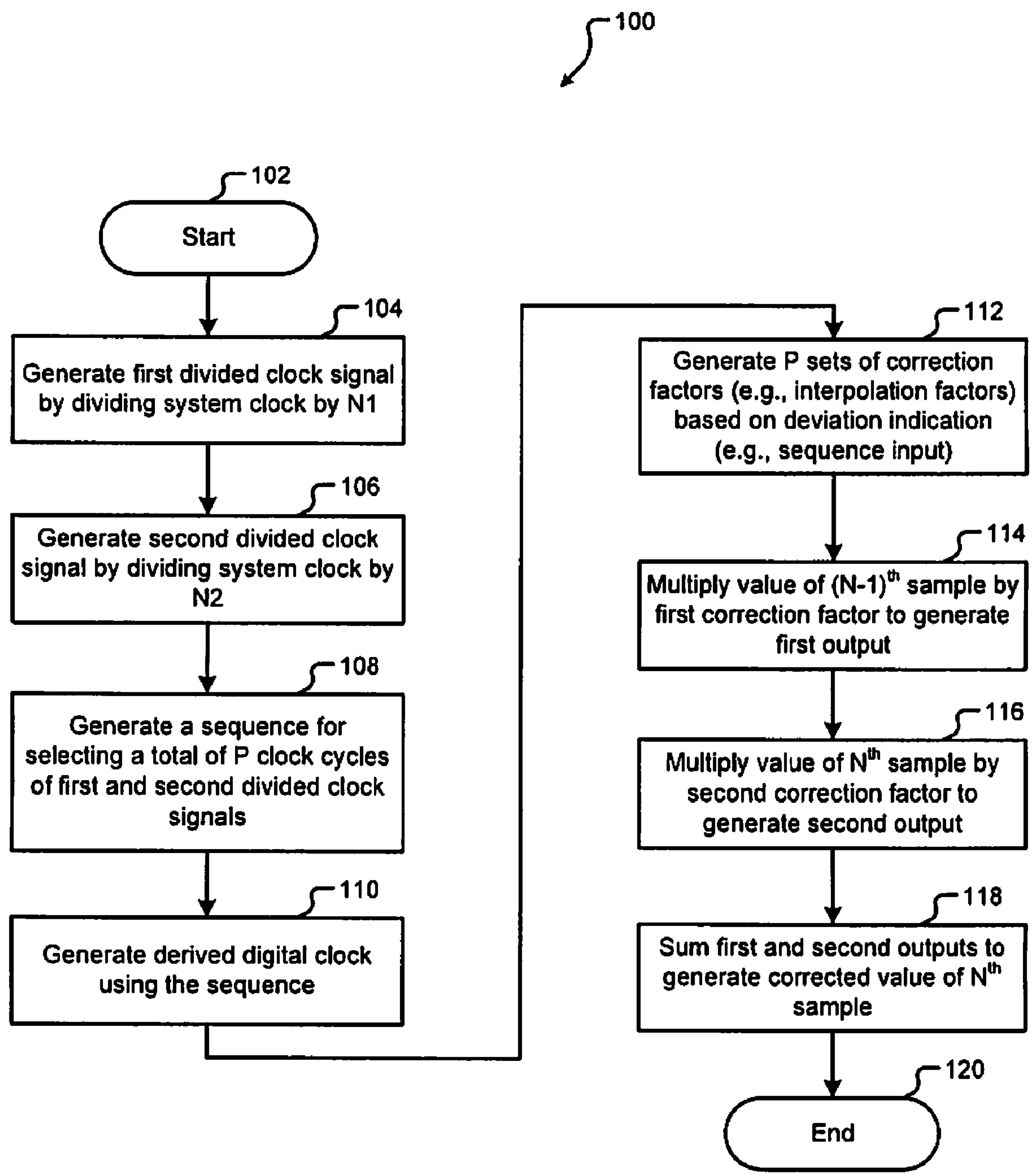
FIG. 11 is a flowchart of a method for jitter correction according to the present disclosure.

Referring now to FIG. 11, an example of a method 100 for correcting jitter is shown. The method 100 begins at step 102. The divider module 14 generates the first divided clock signal by dividing the system clock by N1 in step 104. The divider module 16 generates the second divided clock signal by dividing the system clock by N2 in step 106. The control module 20 generates the sequence for selecting P (e.g., P=32) clock cycles of the first and second divided clock signals in step 108. In step 110, the selector module 18 selects P clock cycles of the first and second divided clock signals according to the sequence and generates the derived digital clock 15.

The P clock cycles may include P1 and P2 clock cycles of the first and second divided clock signals, respectively, where P1 may be different than P2, and P=(P1+P2). Combining P1 and P2 clock cycles in this manner (i.e., in unequal numbers) to generate the derived digital clock 15 is called combining the clock cycles in an unbalanced manner. Accordingly, the derived digital clock 15 may have the average frequency but unequal intervals between clock cycles, which is jitter.

In step 112, the factor generator module 36 generates P sets of correction factors based on the deviation indication received from the clock generator module 10. The clock generator module 10 may derive the deviation indication from the sequence or the algorithm used to generate the derived digital clock 15. The multiplier module 38 multiplies the value of $(N-1)^{th}$ sample by the first correction factor and generates the first output in step 114. The multiplier module 40 multiplies the value of $N^{th}$ sample by the second correction factor and generates the second output in step 114.

The summing module 42 sums the first and second outputs and generates the corrected value of the $N^{th}$ sample. The corrected value of the $N^{th}$ sample is the estimated value of the $N^{th}$ sample that is corrected for jitter in the derived digital clock 15. The corrected value of the $N^{th}$ sample corresponds to the value that the $N^{th}$ sample would have had if sampled by jitter-free clock.

Depending on the correction method used (e.g., linear interpolation), the factor generator module 36 may generate a plurality of correction factors. Additionally, a plurality of multiplication modules may multiply a plurality of consecutive sample values by respective correction factors and generate plurality of outputs, respectively.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A system comprising:

a clock generator module that receives a system clock, that generates a digital clock that is derived from said system clock, wherein said digital clock has an average frequency, and that generates a deviation indication that indicates a deviation of said digital clock from an ideal clock of said average frequency;

an analog-to-digital converter (ADC) that receives an analog signal, that receives said digital clock, and that generates a first stream of values by sampling said analog signal at intervals based on said digital clock; and a correction module that receives said first stream of values and that generates a second stream of values that are corrected based on said deviation indication.

2. The system of claim 1 wherein said digital clock is derived from said system clock using a non-integer derivation, and wherein said deviation indication includes modulo indexes of ADC samples in a modulo cycle of said digital clock.

3. The system of claim 1 wherein said digital clock is generated by combining an unequal number of clock cycles of a plurality of clocks that are integer divisions of said system clock.

4. The system of claim 3 wherein said digital clock is generated by selecting a predetermined sequence of said clock cycles.

5. The system of claim 1 wherein said correction module generates an interpolation factor based on said deviation indication and corrects said first stream of values using said interpolation factor.

6. The system of claim 1 wherein deviations between clock cycles of said digital clock and clock cycles of said ideal clock correspond to jitter.

7. A system comprising:

a clock generator module that receives a system clock, that generates a digital clock that is derived from said system clock, wherein said digital clock has an average frequency, and that generates a deviation indication that indicates a deviation of said digital clock from an ideal clock of said average frequency;

a correction module that receives a first stream of digital values and that generates a second stream of corrected digital values that are corrected based on said deviation indication; and a digital-to-analog converter (DAC) that receives said second stream of corrected digital values, that receives said digital clock, and that generates an analog signal that is based on said second stream of corrected digital values and corresponding sampling points of said digital clock.

8. The system of claim 7 further comprising a delay circuit that delays said digital clock and that generates a delayed digital clock, wherein said DAC generates said analog signal that is based on said second stream of corrected digital values and said delayed digital clock.

9. The system of claim 7 wherein said digital clock is derived from said system clock using a non-integer derivation.

10. The system of claim 7 wherein said digital clock is generated by combining an unequal number of clock cycles of a plurality of clocks that are integer divisions of said system clock.

11. The system of claim 10 wherein said digital clock is generated by selecting a predetermined sequence of said clock cycles.

12. The system of claim 7 wherein said correction module generates an interpolation factor based on said deviation indication and corrects said first stream of values using said interpolation factor.

13. The system of claim 7 wherein deviations between clock cycles of said digital clock and clock cycles of said ideal clock correspond to jitter.

14. A system comprising:

a clock generator module that generates a digital clock by combining clock cycles of a plurality of clock signals in a predetermined sequence;

an analog-to-digital converter (ADC) module that samples an input based on said digital clock and that generates first sample values; and a correction module that generates correction factors based on said predetermined sequence, that corrects said first sample values using said correction factors, and that generates second sample values.

15. The system of claim 14 wherein said clock generator module comprises:

a plurality of divider modules that divides a system clock and that generates said plurality of clock signals;

a control module that generates said predetermined sequence; and a selector module that selects said clock cycles based on said predetermined sequence.

16. The system of claim 15 wherein a first frequency of said system clock is a non-integer multiple of a second frequency of said digital clock.

17. The system of claim 14 wherein said correction module comprises:

a plurality of multiplier modules that multiplies said first sample values by said correction factors and that generates multiplier outputs; and a summing module that sums said multiplier outputs and that generates said second sample values.

18. The system of claim 14 wherein said correction module includes an interpolation module, and wherein said correction factors include interpolation factors.

19. The system of claim 14 wherein said correction module corrects errors in said first sample values that are caused by jitter in said digital clock.

20. The system of claim 14 wherein said correction module further comprises a delay line that includes a plurality of delay elements, that receives said first sample values, and that generates a plurality of delayed outputs.

21. The system of claim 20 wherein said correction module multiplies said delayed outputs by said correction factors, generates multiplication results, and sums said multiplication results to generate said second sample values.

22. A system comprising:

a clock generator module that generates a digital clock by combining clock cycles of a plurality of clock signals in a predetermined sequence;

a correction module that receives first digital sample values, that generates correction factors based on said predetermined sequence, that corrects said first digital sample values using said correction factors, and that generates second digital sample values; and a digital-to-analog converter (DAC) module that converts said second digital sample values into an analog output based on said digital clock.

23. The system of claim 22 further comprising a delay circuit that delays said digital clock and that generates a delayed digital clock, wherein said DAC module generates said analog output based on said delayed digital clock.

24. The system of claim 22 wherein said clock generator module comprises:

a plurality of divider modules that divides a system clock and that generates said plurality of clock signals;

a control module that generates said predetermined sequence; and a selector module that selects said clock cycles based on said predetermined sequence.

25. The system of claim 24 wherein a first frequency of said system clock is a non-integer multiple of a second frequency of said digital clock.

26. The system of claim 22 wherein said correction module comprises:

a plurality of multiplier modules that multiplies said first digital sample values by said correction factors and that generates multiplier outputs; and a summing module that sums said multiplier outputs and that generates said second digital sample values.

27. The system of claim 22 wherein said correction module includes an interpolation module, and wherein said correction factors include interpolation factors.

28. The system of claim 22 wherein said second digital sample values represent said first digital sample values that are adjusted for jitter in said digital clock.

29. A method comprising:

receiving a system clock;

generating a digital clock having an average frequency by deriving said digital clock from said system clock;

generating a deviation indication that indicates a deviation of said digital clock from an ideal clock having said average frequency;

receiving an analog signal and said digital clock;

generating a first stream of values by sampling said analog signal at intervals based on said digital clock;

correcting said first stream of values based on said deviation indication; and generating a second stream of values that are corrected based on said deviation indication.

30. The method of claim 29 further comprising deriving said digital clock from said system clock using a non-integer derivation.

31. The method of claim 29 further comprising generating said digital clock by combining an unequal number of clock cycles of a plurality of clocks that are integer divisions of said system clock.

32. The method of claim 31 further comprising generating said digital clock by selecting a predetermined sequence of said clock cycles.

33. The method of claim 29 further comprising generating an interpolation factor based on said deviation indication and correcting said first stream of values using said interpolation factor.

34. The method of claim 29 wherein deviations between clock cycles of said digital clock and clock cycles of said ideal clock correspond to jitter.

35. A method comprising:

receiving a system clock;

generating a digital clock having an average frequency by deriving said digital clock from said system clock;

generating a deviation indication that indicates a deviation of said digital clock from an ideal clock having said average frequency;

receiving a first stream of digital values;

correcting said first stream of digital values based on said deviation indication;

generating a second stream of corrected digital values that are corrected based on said deviation indication;

receiving said second stream of corrected digital values and said digital clock; and generating an analog signal that is based on said second stream of corrected digital values and corresponding sampling points of said digital clock.

36. The method of claim 35 further comprising generating a delayed digital clock and generating said analog signal that is based on said second stream of corrected digital values and said delayed digital clock.

37. The method of claim 35 further comprising deriving said digital clock from said system clock using a non-integer derivation.

38. The method of claim 35 further comprising generating said digital clock by combining an unequal number of clock cycles of a plurality of clocks that are integer divisions of said system clock.

39. The method of claim 38 further comprising generating said digital clock by selecting a predetermined sequence of said clock cycles.

40. The method of claim 35 further comprising generating an interpolation factor based on said deviation indication and correcting said first stream of values using said interpolation factor.

41. The method of claim 35 wherein deviations between clock cycles of said digital clock and clock cycles of said ideal clock correspond to jitter.

42. A method comprising:

generating a digital clock by combining clock cycles of a plurality of clock signals in a predetermined sequence;

generating correction factors based on said predetermined sequence;

generating first sample values by sampling an input based on said digital clock; and generating second sample values by correcting said first sample values using said correction factors.

43. The method of claim 42 further comprising:

generating said plurality of clock signals by dividing a system clock;

generating said predetermined sequence; and selecting said clock cycles based on said predetermined sequence.

44. The method of claim 43 wherein a first frequency of said system clock is a non-integer multiple of a second frequency of said digital clock.

45. The method of claim 42 further comprising:

generating multiplier outputs by multiplying said first sample values by said correction factors; and generating said second sample values by summing said multiplier outputs.

46. The method of claim 42 wherein said correction factors include interpolation factors.

47. The method of claim 42 further comprising correcting errors in said first sample values that are caused by jitter in said digital clock.

48. The method of claim 42 further comprising:

generating delayed outputs by delaying said first sample values;

generating multiplication results by multiplying said delayed outputs by said correction factors; and generating said second sample values by summing said multiplication results.

49. A method comprising:

generating a digital clock by combining clock cycles of a plurality of clock signals in a predetermined sequence;

generating correction factors based on said predetermined sequence;

receiving first digital sample values;

generating second digital sample values by correcting said first digital sample values using said correction factors; and converting said second digital sample values into an analog output based on said digital clock.

50. The method of claim 49 further comprising generating a delayed digital clock by delaying said digital clock and generating said analog output based on said delayed digital clock.

51. The method of claim 49 further comprising:

generating said plurality of clock signals by dividing a system clock;

generating said predetermined sequence; and selecting said clock cycles based on said predetermined sequence.

52. The method of claim 51 wherein a first frequency of said system clock is a non-integer multiple of a second frequency of said digital clock.

53. The method of claim 49 further comprising:

generating multiplier outputs by multiplying said first sample values by said correction factors; and generating said second sample values by summing said multiplier outputs.

54. The method of claim 49 wherein said correction factors include interpolation factors.

55. The method of claim 49 wherein said second digital sample values represent said first digital sample values that are adjusted for jitter in said digital clock.

* * * * *